(12) United States Patent
Yokotani et al.

(10) Patent No.: US 8,894,251 B2
(45) Date of Patent: Nov. 25, 2014

(54) LIGHTING DEVICE TOPOLOGY FOR REDUCING UNEVENNESS IN LED LUMINANCE AND COLOR

(75) Inventors: Ryoji Yokotani, Osaka (JP); Keiji Kiba, Osaka (JP); Kenichiro Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 453 days.

(21) Appl. No.: 13/176,282

(22) Filed: Jul. 5, 2011

(65) Prior Publication Data
US 2012/0106125 A1 May 3, 2012

(30) Foreign Application Priority Data

Jul. 5, 2010 (JP) ................................. 2010-153429
Aug. 26, 2010 (JP) ................................. 2010-190044

(51) Int. Cl.
| | |
|---|---|
| F21V 3/00 | (2006.01) |
| F21S 4/00 | (2006.01) |
| F21V 9/16 | (2006.01) |
| H01L 25/075 | (2006.01) |
| H01L 33/50 | (2010.01) |
| F21Y 101/02 | (2006.01) |
| H01L 33/60 | (2010.01) |
| F21Y 103/00 | (2006.01) |

(52) U.S. Cl.
CPC ... H01L 25/0753 (2013.01); *H01L 2924/09701* (2013.01); *H01L 33/50* (2013.01); F21S 4/008 (2013.01); F21V 9/16 (2013.01); *F21Y 2101/02* (2013.01); *H01L 33/60* (2013.01); *F21Y 2103/003* (2013.01); *H01L 2224/48091* (2013.01)
USPC .......... 362/311.02; 257/98; 362/84; 362/246; 362/249.02; 362/260

(58) Field of Classification Search
CPC ............... F21K 9/00; F21K 9/50; F21K 9/56; H01L 33/50; H01L 33/58; H01L 33/505; H01L 33/507; H01L 33/508
USPC ............ 257/98; 362/84, 246, 249.02, 249.06, 362/260, 311.02
See application file for complete search history.

(56) References Cited

U.S. PATENT DOCUMENTS 7,224,000 B2 * 5/2007 Aanegola et al. ............... 257/98
2004/0119668 A1 6/2004 Homma et al.
(Continued)

FOREIGN PATENT DOCUMENTS

| JP | 2007042320 | 2/2007 |
|---|---|---|
| JP | 2007306035 | 11/2007 |
| JP | 2009130299 | 6/2009 |
| JP | 20100123918 | 6/2010 |
| JP | 20100129615 | 6/2010 |
| JP | 2010147189 | 7/2010 |

*Primary Examiner* — Stephen F Husar
(74) *Attorney, Agent, or Firm* — Waddey Patterson; Mark J. Patterson; Gary L. Montle

(57) ABSTRACT

A lighting device is provided in accordance with the present invention having reduced luminance and color unevenness. A plurality of solid-state light emitting elements are mounted on a base substrate. An optical member is further mounted on the substrate and arranged so as to cover light emitting surfaces of the light emitting elements, the optical member having a semicircular or semielliptical cross-sectional surface, and gutter-shaped in a longitudinal direction with respect to the substrate. A wavelength converting member covers the semicircular or semielliptical cross-sectional surface of the optical member, and is excitable by light from the solid-state light emitting elements to thereby emit wavelength-converted light. In various embodiments light diffusion members may be further distributed among the light emitting elements.

17 Claims, 16 Drawing Sheets

(56) References Cited

U.S. PATENT DOCUMENTS

| | | |
|---|---|---|
| 2005/0051782 A1 | 3/2005 | Negley et al. |
| 2005/0239227 A1 | 10/2005 | Aanegola et al. |
| 2005/0264716 A1 | 12/2005 | Kim et al. |
| 2006/0097385 A1 | 5/2006 | Negley |
| 2008/0290351 A1 | 11/2008 | Ajiki et al. |
| 2009/0140271 A1 | 6/2009 | Sah |
| 2009/0296017 A1 | 12/2009 | Itoh et al. |
| 2011/0006323 A1* | 1/2011 | Suzuki et al. ............ 257/98 |

* cited by examiner

LIGHTING DEVICE TOPOLOGY FOR REDUCING UNEVENNESS IN LED LUMINANCE AND COLOR

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent applications which is/are hereby incorporated by reference: Japanese Patent Application Publication No. 2010-153429 and Japanese Patent Application Publication No. 2010-190044.

BACKGROUND OF THE INVENTION

The present invention relates to a lighting device that uses a plurality of solid-state light emitting elements as a light source and as applied to an illumination fixture.

Lighting devices are known in which a plurality of solid-state light emitting elements are mounted on a board. In general, the plurality of solid-state light emitting elements may be light-emitting diodes (hereinafter referred to as LEDs) that emit blue light. In this sort of lighting device, the plurality of LEDs mounted on the board are individually sealed by a translucent resin layer and covered by a wavelength converting member. The wavelength converting member contains phosphors that convert the blue light emitted from the plurality of LEDs to, for example, yellow light. Based on this, when the blue light is irradiated on the phosphors, the yellow light is emitted from the phosphors. The blue light not irradiated on the phosphors and the yellow light are accordingly combined and emitted as white light from a surface of the wavelength converting member.

Typically, in the lighting device, the solid-state light emitting elements are uniformly distributed. However, the phosphors in the solid-state light emitting elements are not necessarily uniform, and therefore color unevenness occurs as a whole. Also, a light emitting portion of the solid-state light emitting element is relatively small in size, and therefore luminance of the light emitting part is increased and results in a degree of undesirable glare.

A lighting device as previously known in the art may address these problems by leading out light through a fluorescent substance layer and a diffusion layer that are provided in common, separate from a solid-state light emitting element array. However, such a lighting device has two problems described below.

First, although the fluorescent substance layer is arranged separately from the solid-state light emitting elements, a sealing member is in close contact with the fluorescent substance layer through an adhesive layer, so that emission light from the solid-state light emitting elements is directly incident on the fluorescent substance layer, and an incident density on the fluorescent substance layer becomes uneven depending on light distribution of the solid-state light emitting elements or distance between the solid-state light emitting elements to thereby give rise to luminance unevenness. Also, a distribution of incident angles on respective sites of the fluorescent substance layer becomes uneven to further give rise to color unevenness.

A second problem is that the fluorescent substance layer generally has a plate-like shape, so that a component of which an incident angle from the solid-state light emitting elements onto the fluorescent substance layer is large is easily reflected, and therefore light extraction efficiency is reduced.

Also, positions where the LEDs are mounted on the board and amounts of the translucent resin layer that seals the LEDs may generally be uneven among the plurality of LEDs, and therefore distances between the LEDs and the wavelength converting member become uneven. Luminance and color of the light emitted from the surface of the wavelength converting member vary depending on a position on the surface, and therefore luminance unevenness and color unevenness may occur.

BRIEF SUMMARY OF THE INVENTION

A lighting device in accordance with the present invention is provided with an object of reducing luminance unevenness and color unevenness among light emitting portions, and thereby forming an even and continuous light emitting surface.

In an embodiment, a lighting device includes a plurality of solid-state light emitting elements are mounted on a base substrate. An optical member is further mounted on the substrate and arranged so as to cover light emitting surfaces of the light emitting elements, the optical member having a semicircular or semielliptical cross-sectional surface, and gutter-shaped in a longitudinal direction with respect to the substrate. A wavelength converting member covers the semicircular or semielliptical cross-sectional surface of the optical member, and is excitable by light from the solid-state light emitting elements to thereby emit wavelength-converted light.

In another embodiment, a lighting device according to the present invention includes a plurality of solid-state light emitting elements with a first translucent resin layer arranged to cover each of the light emitting elements. A light converting member is positioned to cover an outer surface of the first translucent resin layer, either directly or through a second translucent resin layer or an air layer. The light converting member further contains a phosphor that converts a wavelength of emission light of the plurality of solid-state light emitting elements. A light diffusion member is formed between the plurality of solid-state light emitting elements and is further effective to diffuse the light emitted from the plurality of solid-state light emitting elements.

In another embodiment, an illumination fixture is provided for mounting a lighting device according to the present invention. A base plate and two side plates integrally form a substantially U-shaped fixture main body and further define an interior. Light distribution controlling reflectors are coupled to distal ends of at least one side plate. A wiring board is coupled to an interior surface of the base plate, and a plurality of solid-state light emitting elements are mounted on the wiring board. An optical member is further mounted on the wiring board and arranged so as to cover light emitting surfaces of the plurality of solid-state light emitting elements. The optical member generally has a semicircular or semielliptical cross-sectional surface, and is gutter-shaped in a longitudinal direction with respect to the wiring board. A wavelength converting member covers the semicircular or semielliptical cross-sectional surface of the optical member, and is excitable by light from the solid-state light emitting elements to thereby emit wavelength-converted light.

DETAILED DESCRIPTION OF THE INVENTION

Figure 1:
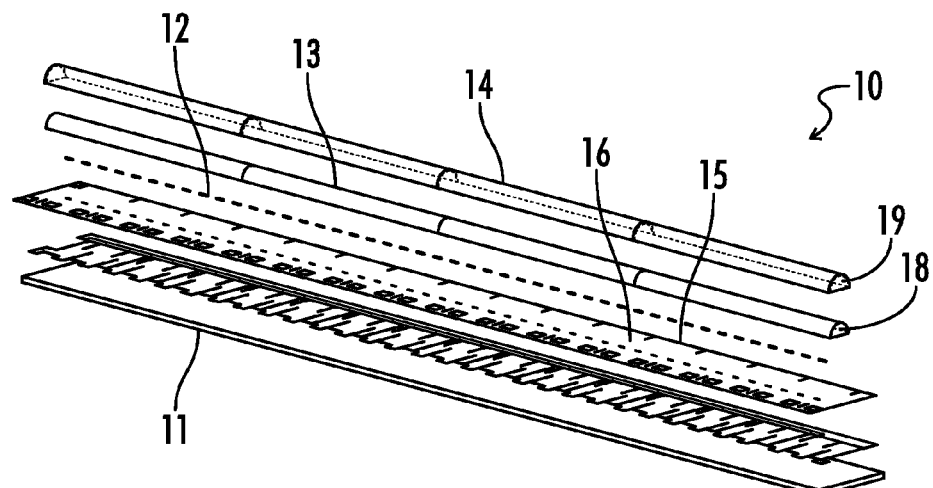
FIG. 1 is an exploded perspective view of an embodiment of a lighting device according to the present invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

Referring generally to FIGS. 1-39, various embodiments may now be described herein of a lighting device that is effective to reduce luminance and color unevenness in associated light-emitting elements, and may further form an even and continuous light-emitting surface. Where the various figures may describe embodiments sharing various common elements and features with other embodiments, similar elements and features are given the same reference numerals and redundant description thereof may be omitted below. For purposes of explanation and illustration only, "front", "side" and "top" views may be referred to herein to orient the reader with regards to the device components, but are not intended as being limiting on actual configurations or positions in which the device may be mounted.

Referring to FIG. 1, an embodiment of a lighting device 10 according to the present invention is provided with an oblong wiring board 11 (substrate), a plurality of solid-state light emitting elements 12 mounted on the wiring board 11, an optical member 13 that is provided so as to commonly cover the various light emitting surfaces of the plurality of solid-state light emitting elements 12, and a wavelength converting member 14 that covers an outward facing surface (light emitting surface) of the optical member 13, and is excited by light led out from the solid-state light emitting elements 12 to emit wavelength-converted light.

Figure 2:
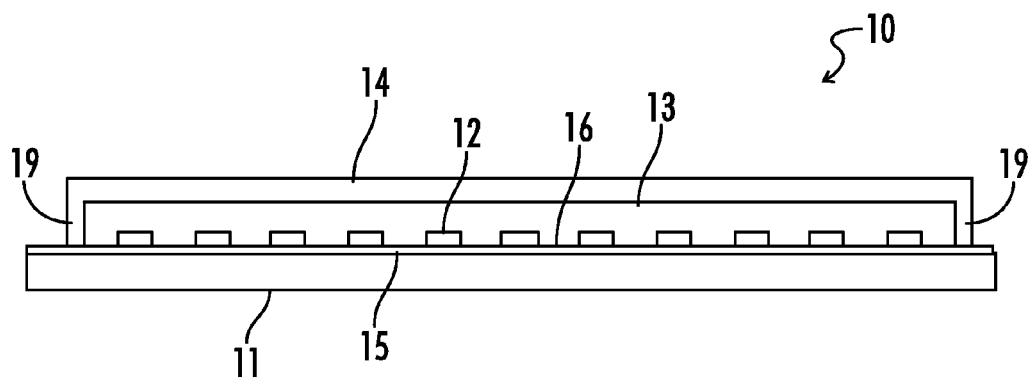
FIG. 2 is a cross-sectional front view of the lighting device of FIG. 1.
Figure 3:
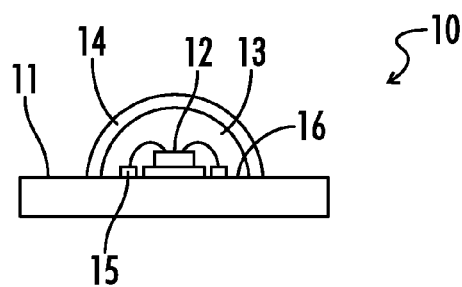
FIG. 3 is a cross-sectional side view of the lighting device of FIG. 1.

As represented in FIGS. 2 and 3, the wiring board 11 may be molded with the use of metal such as aluminum, glass epoxy, or ceramics as a base material. The wiring board 11 has an upper surface provided with a wiring pattern 15 for supplying electricity to the solid-state light emitting elements 12. On an upper surface of the wiring pattern 15, a white resist film 16 is provided. The wiring board 11 is of an oblong shape having, for example, a length dimension of 200 mm×a width dimension of 20 mm.

Each of the solid-state light emitting elements 12 may be a nitride semiconductor (LED) arranged to emit blue light having an emission peak wavelength of 460 nm. Each of the solid-state light emitting elements 12 has a size of 0.3 mm.

The plurality of solid-state light emitting elements 12 are mounted in a single line on the wiring board 11 in a longitudinal direction at regular intervals. An exemplary mounting method for the solid-state light emitting elements 12 employs a combination of die bonding and wire bonding, but flip-chip bonding may also be used. The type and size of the solid-state light emitting element 12 are not limited to those described above. In addition, the plurality of solid-state light emitting elements 12 may alternatively be mounted in a plurality of lines. In such a case, a size of a cross section of the optical member 13 is only required to be equal to or more than a number obtained by multiplying a size of a circumscribed circle of the plurality of solid-state light emitting elements 12 within the cross section by a refractive index of the optical member 13.

Figure 4:
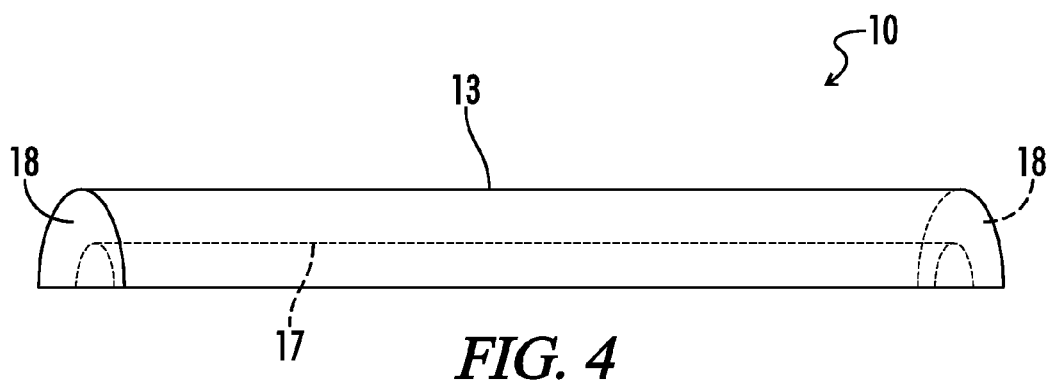
FIG. 4 is a perspective view of an optical member in the lighting device of FIG. 1.

As illustrated in FIG. 4, an embodiment of the optical member 13 may be made of transparent silicone resin, and have a semicircular outer cross section with respect to either side or end, substantially similar for example to a half-pipe or gutter shape. Generally speaking, the optical member may have a size capable of covering the plurality of solid-state light emitting elements 12. The optical member 13 has a diameter of the outer cross section equal to or more than the number obtained by multiplying a diameter of the circumscribed circle of the solid-state light emitting elements 12 by the refractive index (in the case of the silicone resin, 1.41 times) of the optical member 13. Inside the optical member 13 including a center of the cross section, a concave portion 17 is formed, and has a size capable of containing the plurality of solid-state light emitting elements 12 inside. At either end of the optical member 13, lid portions 18 not having the concave portion 17 are formed. The concave portion 17 inside the optical member 13 may be filled with silicone resin having the same refractive index as that of the optical member 13, and the optical member 13 is mounted on the wiring board 11 so as to cover the plurality of solid-state light emitting elements 12 to be thereby sealed, mounted, and fixed. The optical member 13 has a structure integrated with the sealing resin after curing, and therefore does not give rise to any interface. The optical member 13 has a central axis that corresponds to a mounting axis of the plurality of solid-state light emitting elements 12. Note that a material for the optical member 13 is not limited to the silicone resin but may be for example epoxy resin, or an inorganic material such as glass. Also, the outer cross-sectional shape of the optical member 13 is not necessarily limited to the semicircular shape, but may be for example a semielliptical shape.

Figure 5:
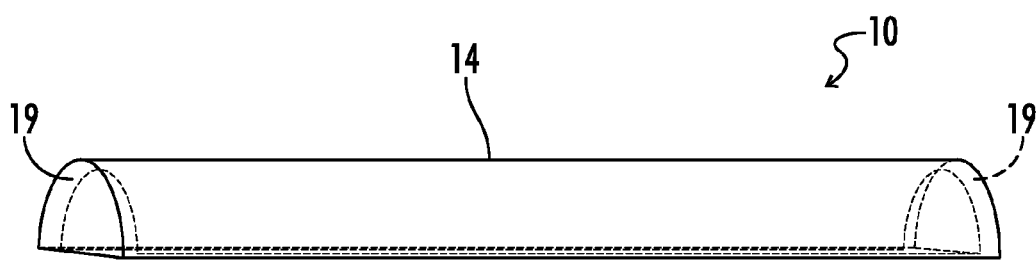
FIG. 5 is a perspective view of a wavelength converting member of the lighting device of FIG. 1.

As illustrated in FIG. 5, the wavelength converting member 14 is made of a mixed material such as transparent heat-resistant resin (e.g., silicone resin) having a refractive index of 1.2 to 1.5, and in which is dispersed particulate yellow phosphors that are excited by blue light emitted from the solid-state light emitting elements 12 to emit yellow light. The wavelength converting member 14 may not be limited to the yellow phosphors, but may alternatively or further employ phosphors having a plurality of mixed colors for the purposes of color adjustment, increasing color rendering properties, and the like. For example, the wavelength converting member 14 may employ red phosphors and green phosphors to thereby obtain white light having high color rendering properties. The wavelength converting member 14 is formed in a sheet-like shape having a thickness of 0.5 to 1 mm that is molded into a shape coming into close contact with the optical member 13, and at both ends thereof lid portions 19 having a thickness less than a thickness of the curved portions of the member 14 are formed. The wavelength converting member 14 has a shape similar to the optical member 13, and is therefore mounted so as to cover the optical member 13 through silicone resin with being in close contact with the optical member 13. Note that in various embodiments the wavelength converting member 14 may be formed by being physically coated on a surface of the optical member 13.

Figure 6:
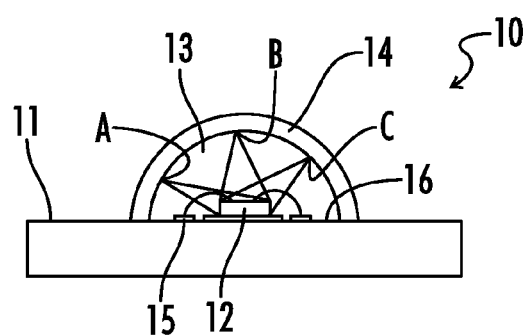
FIG. 6 is a cross-sectional side view for describing an optical characteristic of the lighting device of FIG. 1.

Next, optical characteristics of the lighting device 10 are described. As illustrated in FIG. 6, the blue light emitted from the plurality of solid-state light emitting elements 12 is incident on the wavelength converting member 14 through the optical member 13. A portion thereof is converted in wavelength by the phosphors inside the wavelength converting member 14 to emit wavelength-converted light, and the wavelength-converted light is mixed with the blue light, which is emitted without being converted in wavelength, and emitted from a surface of the wavelength converting member 14 as the white light. Light emitted from a single solid-state light emitting element 12 does not diverge because the wavelength converting member 14 has a semi-circular shape around the solid-state light emitting element 12 and a sufficiently large size with respect to an emission surface of the solid-state light emitting element 12, and therefore an angle distribution is relatively small among light components incident on arbitrary incident points A, B, and C in the cross section of the wavelength converting member 14. For this reason, a surface reflection component is reduced at an interface on an emission surface of the wavelength converting member 14. This allows the lighting device 10 to efficiently extract the light. Further, a distribution in light path length inside the wavelength converting member 14 is made uniform at substantially any arbitrary point of the wavelength converting member 14, and therefore color unevenness and luminance unevenness can be reduced.

According to the above-described embodiment of the lighting device 10 according to the present invention, the cross-sectional shapes of the optical member 13 including any of the solid-state light emitting elements 12 and the wavelength converting member 14 are semicircular around the solid-state light emitting element 12. Therefore, lights emitted from the solid-state light emitting element 12 in a cross-sectional direction of the optical member 13 are all incident on the wavelength converting member 14 so as to have the small angle distribution, and the color unevenness and luminance unevenness can be reduced. Also, as compared with a structure in which the solid-state light emitting elements 12 are arrayed, a surface area of the wavelength converting member 14 is increased so that luminance of the light emitting part, and thereby glare, can be reduced.

Figure 7:
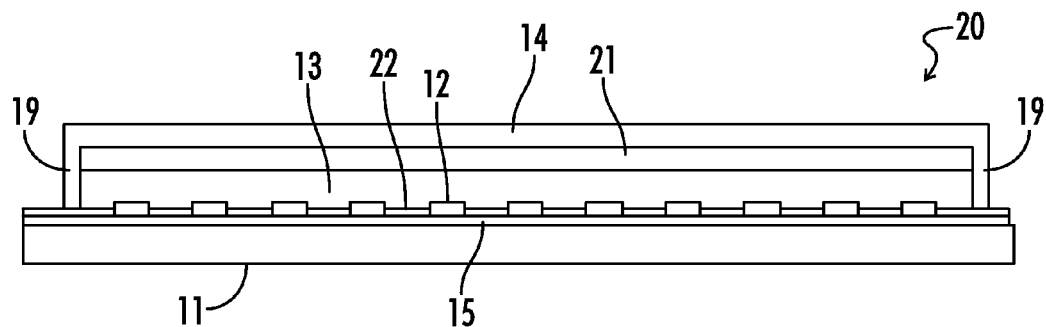
FIG. 7 is a cross-sectional front view of another embodiment of a lighting device according to the present invention.
Figure 8:
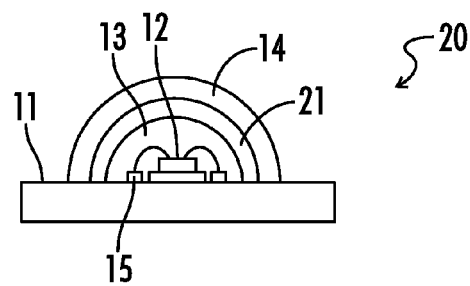
FIG. 8 is a cross-sectional side view of the lighting device of FIG. 7.
Figure 9:
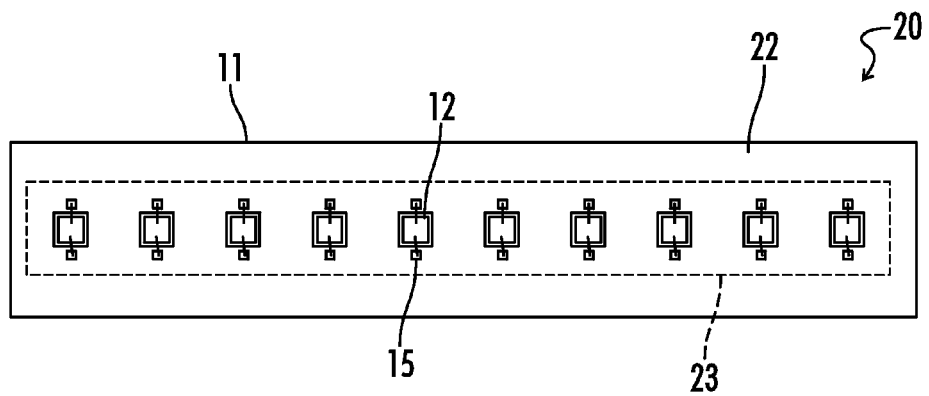
FIG. 9 is a plan view of the lighting device of FIG. 7.

In another exemplary embodiment as illustrated in FIGS. 7 to 9, a lighting device 20 according to the present invention has a high reflectance region that is on a surface of a wiring board 11 and includes a lower surface of an optical member 13, and has an air layer 21 between the optical member 13 and a wavelength converting member 14. The wavelength converting member 14 has a thickness of, for example, 0.5 to 1 mm, and a lower surface of the wavelength converting member 14 and the wiring board 11 are coupled to each other through silicone resin. The lighting device 20 also has a high reflective white resist film 22 in regions other than those mounting and wire bonding portions of solid-state light emitting elements 12 on a surface of the wiring board 11 to thereby achieve high reflectance. The lower surface of the optical member 13 has high diffusion reflectance properties.

Figure 10:
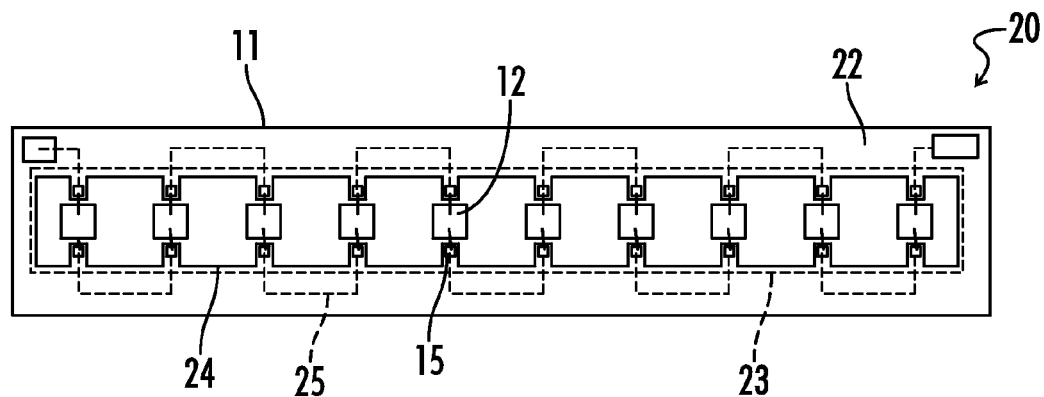
FIG. 10 is a plan view illustrating an internal structure of the lighting device of FIG. 7.

As illustrated in FIG. 10, the lighting device 20 is configured such that, in an optical member mounting portion 23 on which the optical member 13 is mounted, a die bonding pattern 24 and an energizing pattern 25 for the solid-state light emitting elements 12 are separated from each other. The die bonding pattern 24 substantially coincides with the lower surface of the optical member 13, and the energizing pattern 25 has a pattern configuration that extends from outside the die bonding pattern 25 to vicinities of the solid-state light emitting elements 12 with use of narrow lines. The die bonding pattern 24 is not covered with the white resist film 22, but exposed outside as a pattern. The die bonding pattern 24 may be subjected to high reflection processing such as silver plating or aluminum evaporation.

Figure 11:
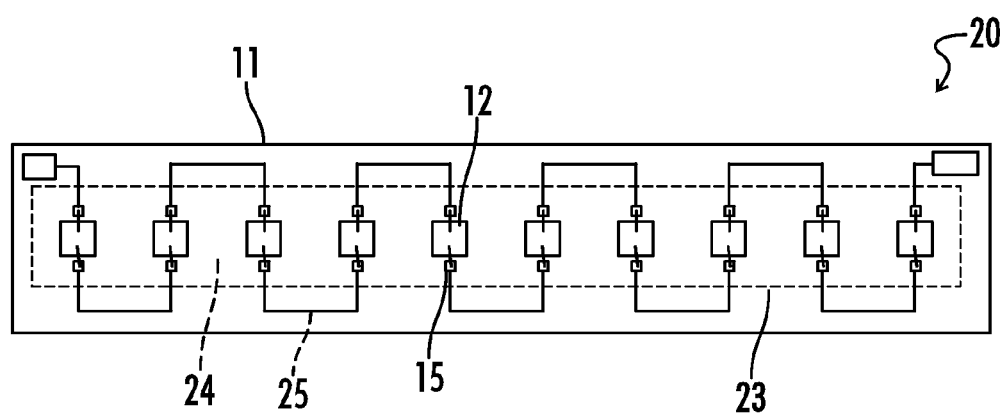
FIG. 11 is a plan view of a variation of the lighting device of FIG. 7.

As illustrated in FIG. 11, an alternative configuration of the lighting device 20 includes a wiring board 11 made of highly reflective ceramic, and only the requisite minimum of the energizing pattern 25 formed on the wiring board 11 is formed within the lower surface of the optical member 13.

Figure 12:
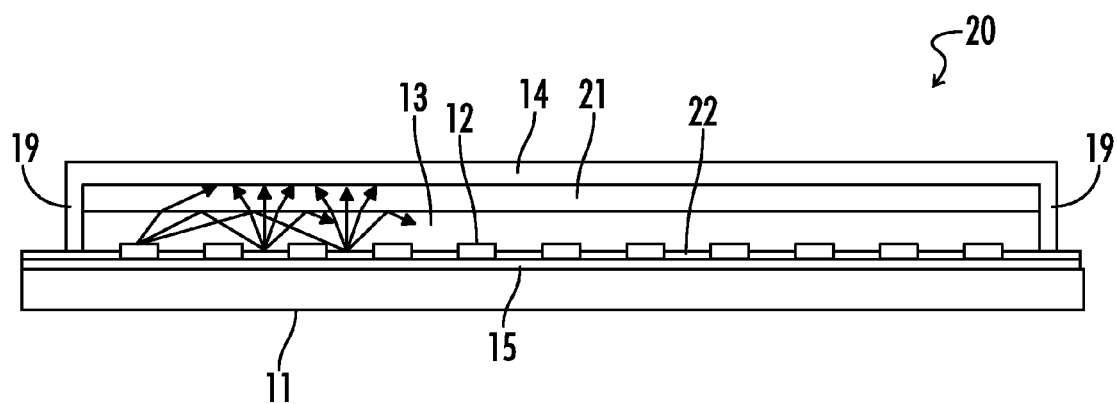
FIG. 12 is a cross-sectional front view for describing an optical characteristic of the lighting device of FIG. 7.

Next, an exemplary optical characteristic of the lighting device 20 may be described. As illustrated in FIG. 12, an air layer 21 is present between the optical member 13 and the wavelength converting member 14, such that in a light component traveling in a longitudinal direction (i.e., end-to-end) of the optical member 13 a total reflection component is increased at an interface on an emission surface of the optical member 13, and therefore a light guiding action in the longitudinal direction is performed. At this time, light that is diffusely reflected on the reflection surface of the wiring board 11 on the lower surface of the optical member 13 and thereby changed in angle is evenly emitted at an arbitrary point from the optical member 13. This allows a light component (incident amount, incident angle distribution) incident on an arbitrary point of the wavelength converting member 14 to become more even, and reduces color unevenness and luminance unevenness in the wavelength converting member 14 serving as a light emitting portion. Also, if a void or cavity occurs in the process of molding of the optical member 13 or mounting on the wiring substrate 11, light from the solid-state light emitting elements 12 is changed in angle due to the void, and therefore unevenness occurs in emission light from an outer surface of the optical member 13. In this case, if as in the lighting device 10 the wavelength converting member 14 is in close contact with the optical member 13, the emission light unevenness gives rise to luminance unevenness on the surface of the wavelength converting member 14 serving as the light emitting part in a transferred form. However, in the lighting device 20, the wavelength converting member 14 is separated from the optical member 13, and therefore the influence of the transfer is reduced.

Blue light reflected on the wavelength converting member 14 and yellow light emitted on the solid-state light emitting element 12 side may be further reflected on the surface of the wiring board 11 to be re-incident on the wavelength converting member 14, and then emitted outside the lighting device 20. For this reason light extraction efficiency can be improved. Also, if the reflective surface on the surface of the wiring board 11 is a diffuse reflective surface, the re-incident component can be evenly incident on the wavelength converting member 14, and therefore the luminance unevenness and color unevenness in the longitudinal direction can be reduced.

The air layer 21 is present between the optical member 13 and the wavelength converting member 14, so that the total reflection component is increased at the interface on the light emitting (i.e., outward facing) surface of the optical member 13, and therefore the light guiding action in the longitudinal direction is performed. At this time, the light diffusely reflected on the reflection surface of the wiring board 11 on the lower surface of the optical member 13 is emitted from the optical member 13, so that a light component incident on an arbitrary point of the wavelength converting member 14, and therefore the color unevenness and luminance unevenness, becomes generally more even. Also, in an example the wavelength converting member 14 is separated from the optical member 13, so that unevenness in blue light emission distribution due to a void occurring inside the optical member 13 is not transferred to the wavelength converting member 14, and therefore the luminance unevenness in the light emitting part can be reduced. Further, in view of optical components of incident light on the wavelength converting member 14 and converted light generated inside, which are emitted on the solid-state light emitting element 12 side, a component totally reflected on the inner surface of the wavelength converting member 14 is increased, and therefore light extraction efficiency can be improved.

Figure 13:
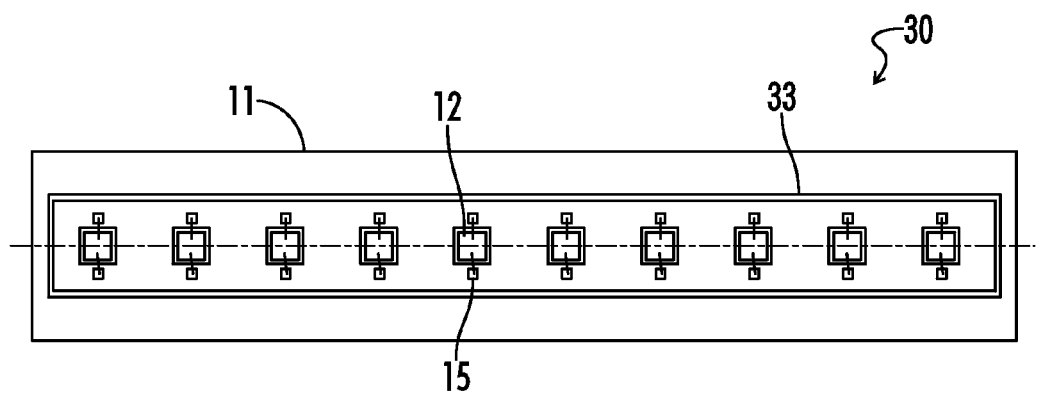
FIG. 13 is a plan view of another embodiment of a lighting device according to the present invention.
Figure 14:
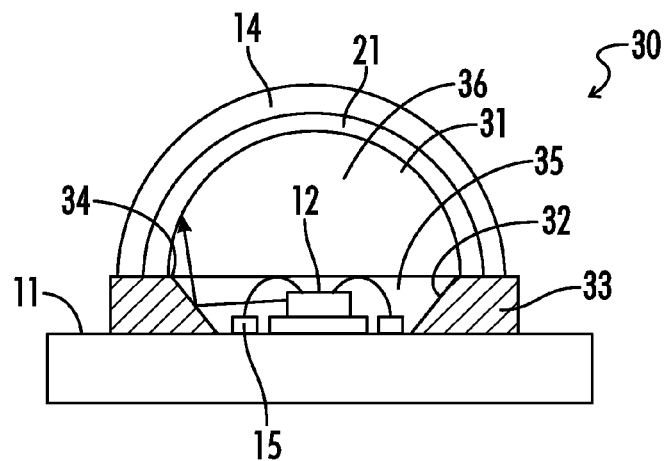
FIG. 14 is a cross-sectional side view of the lighting device of FIG. 13.

Next, an embodiment of a lighting device according to the present invention and as illustrated in FIGS. 13 and 14 is, between an optical member 31 and a wiring board 11 mounted with solid-state light emitting elements 12, provided with a frame body 33 having a concave portion 32 containing the plurality of solid-state light emitting elements 12. In an exemplary configuration wherein the concave portion 32 of the frame body 33 contains the solid-state light emitting elements 12, a part of the concave portion 32 is embedded in the optical member 31.

The frame body 33 has a height sufficient to contain the solid-state light emitting elements 12 including a bonding wire portion around the plurality of solid-state light emitting elements 12 on the wiring board 11. An inner shape thereof is a tapered shape that is narrowed toward the wiring board 11 at for example 45 degrees, and an upper opening portion 34 has an outside diameter that is almost the same as that of the optical member 31. The frame body 33 is mounted on the wiring board 11 through an adhesive (made of silicone), and at least an inner surface thereof has high reflectance. The frame body 33 is made of a highly reflective component such as for example polybutylene terephthalate. Note that the tapered shape of the frame body 33 is not limited to a shape having the 45 degrees. Also, the frame body 33 may be made of metal such as aluminum, or heat resistant resin, or one having an inner surface on which aluminum or silver is evaporated, or made of highly reflective ceramic. Also, the frame body 33 may be a ceramic substrate formed integral with the concave portion 32.

The optical member 31 is mounted with a portion thereof being inserted into the frame body 33. The wavelength converting member 14 is bonded and fixed onto the frame body 33 through silicone resin at end portions thereof. Note that the wavelength converting member 14 may be fixed to the wiring board 11 by coupling so as to cover the frame body 33.

Next, a procedure for forming the optical member 31 in the lighting device 30 is described. When the optical member 31 is formed, first, the concave portion 32 of the frame body 33 is filled with a transparent silicone resin material 35. Then, a transparent member material 36 that is formed of transparent resin similar to the transparent silicone resin material 35, has a semicircular cross-sectional shape, and is shaped in a half-pipe or gutter-type configuration in a longitudinal direction is joined through the transparent silicone resin material 35. This enables the optical member 31 to be easily manufactured without giving rise to any void inside thereof.

Figure 15:
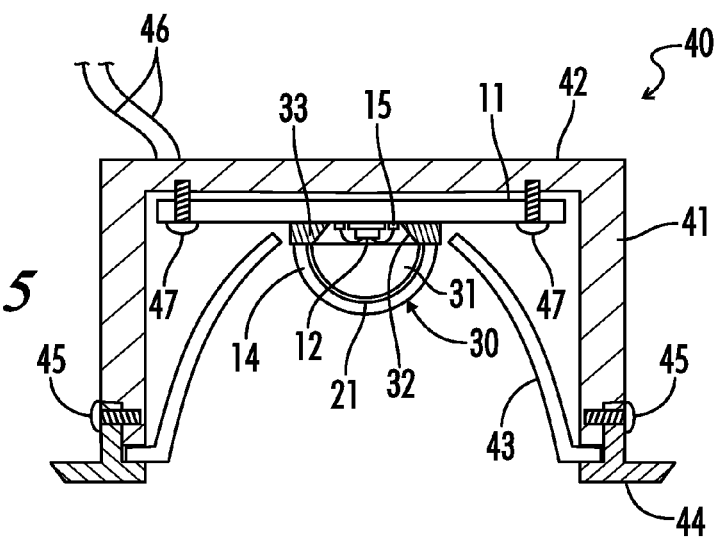
FIG. 15 is a cross-sectional view of an illumination fixture applied with the lighting device of FIG. 13.

As illustrated in FIG. 15, an illumination fixture 40 which includes or is otherwise fitted with the lighting device 30 is a base light embedded in a ceiling surface, and a lower surface of a top plate 42 of a fixture main body 41 opened downward is coupled to the lighting device 30. The front of the lighting device 30 is attached with a light distribution controlling reflector 43, and an opening side end portion of the fixture main body 41 is attached with a flange-shaped metallic frame member 44 with fixing screws 45. From the wiring board 11, a power supply line 46 for energizing the solid-state light emitting elements 12 is drawn out, and electrically connected to a power supply device (not shown) outside the fixture main body 41. The wiring board 11 is attached onto the lower surface of the top plate 42 of the fixture main body 41 by fastening devices 47 such as for example screws 47 or the like. Note that the light distribution controlling reflector 43 may be a lens.

In the illumination fixture 40 including the lighting device 30, light emitted horizontally and downward from side surfaces of the solid-state light emitting elements 12 is reflected upward by the inner surface of the frame body 33, and the lower surface opening part of the light distribution controlling reflector 43 is arranged below a top end of the frame body 33, so that the light can be efficiently incident on the light distribution controlling reflector 43. Also, the illumination fixture 40 does not give rise to leak light from the light distribution controlling reflector 43.

Figure 16:
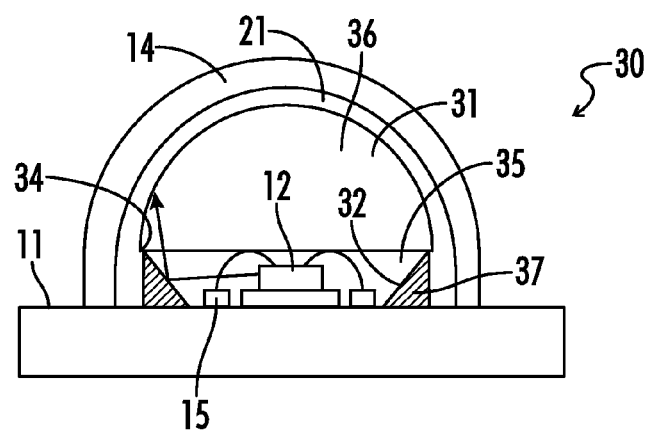
FIG. 16 is a cross-sectional side view of a variation of the lighting device of FIG. 13.

As illustrated in FIG. 16, a variation of the lighting device 30 is configured such that an end portion of the wavelength converting member 14 is joined to the wiring board 11 so as to cover a frame body 37. In such a variation, an outer shape of the frame body 37 can be decreased in size.

Further according to the lighting device 30 as represented in FIG. 16, when the optical member 31 is formed the concave portion 32 of the frame body 33 or 37 is filled with the transparent silicone resin material 35, and then the transparent member material 36 that is formed of transparent resin similar to the transparent silicone resin material 35, has a semicircular cross-sectional shape, and is gutter-shaped in the longitudinal direction, is joined through the transparent silicone resin material 35. This enables the optical member 31 to be easily manufactured without giving rise to any void inside thereof. Also, yield can be improved and a manufacturing process can be simplified, so that manufacturing cost can be significantly reduced. Fixture efficiency of the illumination fixture 40 can further be significantly improved.

Figure 17:
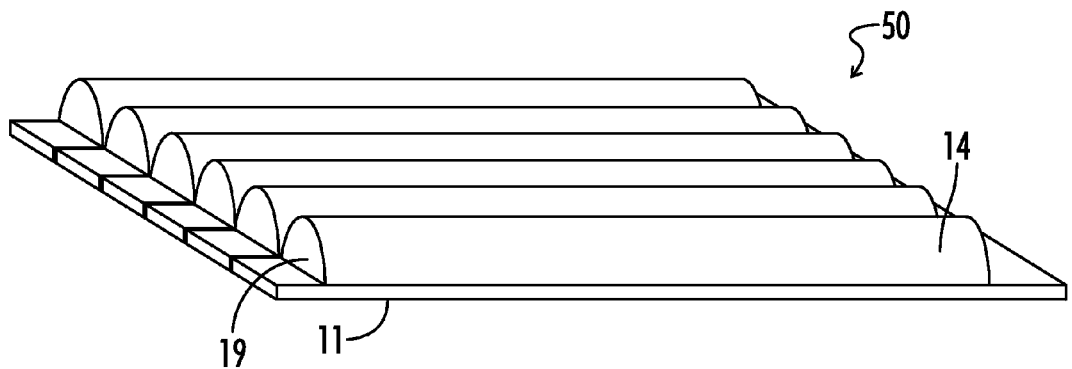
FIG. 17 is a perspective view of another embodiment of a lighting device according to the present invention.
Figure 18:
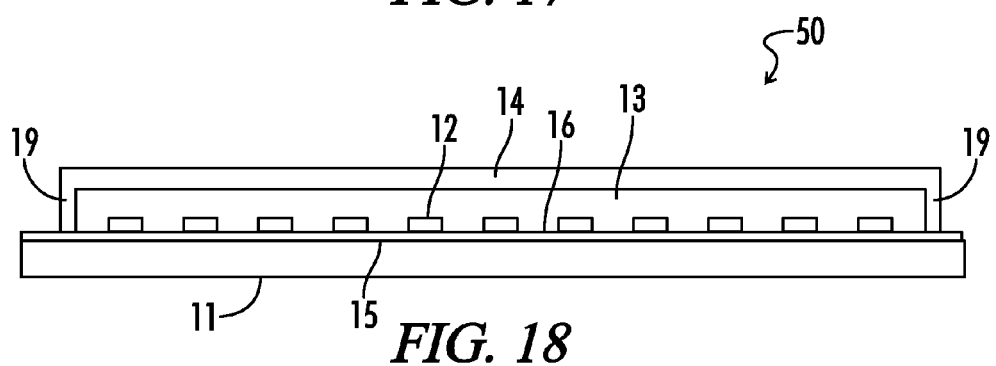
FIG. 18 is a cross-sectional front view of the lighting device of FIG. 17.
Figure 19:
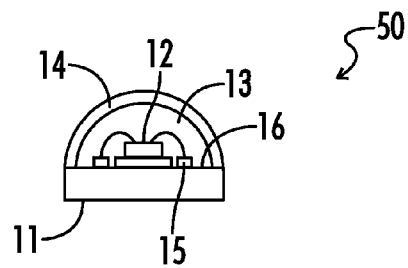
FIG. 19 is a cross-sectional side view of the lighting device of FIG. 17.

Another embodiment of a lighting device according to the present invention as illustrated in FIG. 17 is configured such that end sides of a wiring board 11 and wavelength converting member 14 on a width direction side (i.e., from front-to-back or otherwise defining a width orthogonal to a length associated with the longitudinal direction) of the wiring board 11 and the wavelength converting member 14 coincide in position with each other. As illustrated in FIGS. 18 and 19, the lighting device 50 is configured such that the end sides of the wiring board 11 and the wavelength converting member 14 on the width direction side coincide in position with each other, and therefore by bringing a plurality of adjacent one sides on the width direction side close to each other, a uniform surface emitting light source can be easily formed.

According to the lighting device 50 of the embodiment according to FIGS. 17 to 19, when multiple pieces are adjacently arranged a size and a shape of a continuous emission surface can be easily changed.

Figure 20:
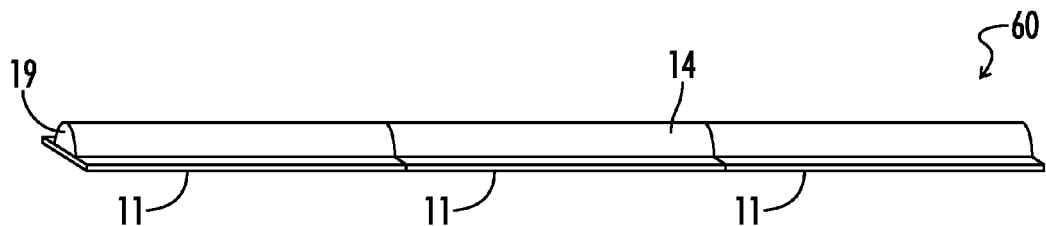
FIG. 20 is a perspective view of another embodiment of a lighting device according to the present invention.
Figure 21:
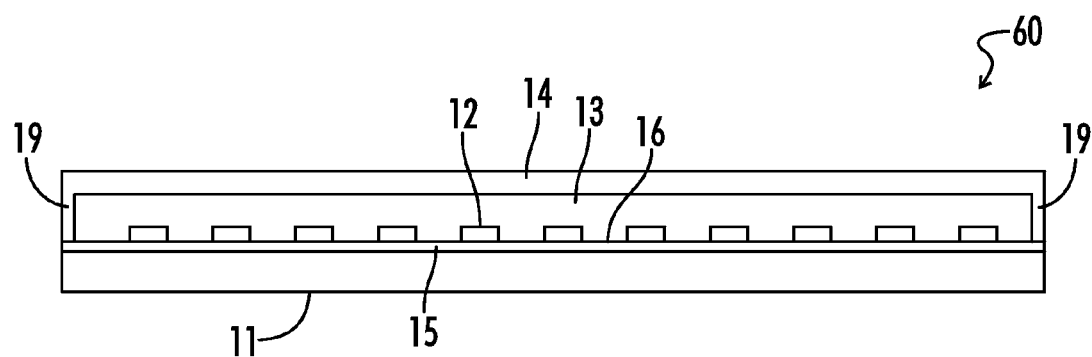
FIG. 21 is a cross-sectional front view of the lighting device of FIG. 20.
Figure 22:
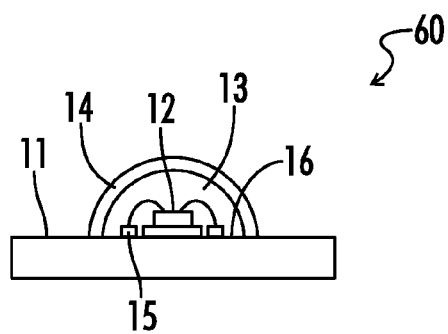
FIG. 22 is a cross-sectional side view of the lighting device of FIG. 20.

As represented in FIG. 20, another embodiment of a lighting device according to the present invention is configured such that end sides of the wiring board 11 and the wavelength converting member 14 on a length direction side (i.e., the longer side) coincide in position with each other. As further illustrated in FIGS. 21 and 22, the lighting device 60 is configured such that the end sides of the wiring board 11 and the wavelength converting member 14 on the length direction side coincide in position with each other, and therefore by bringing a plurality of units adjacent to each other along their lengths and without any space (as shown in FIG. 20), uniform light emission can be easily formed.

Figure 23:
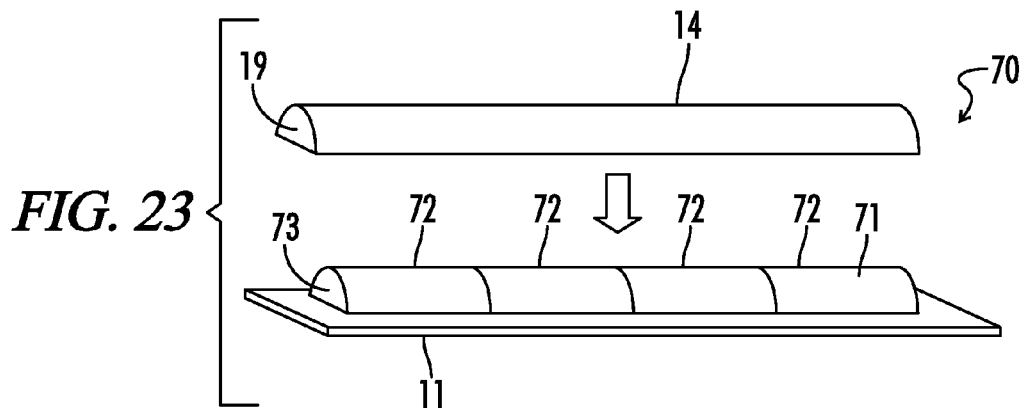
FIG. 23 is a perspective view of another embodiment of a lighting device according to the present invention.
Figure 24:
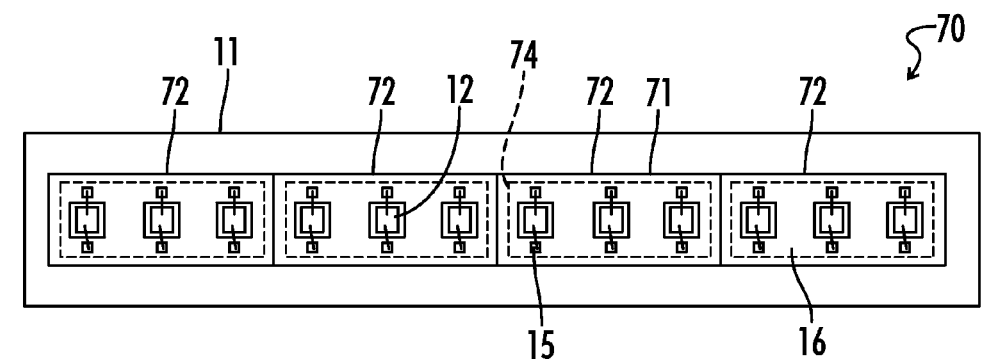
FIG. 24 is a plan view of the lighting device of FIG. 23.

Referring now to FIGS. 23 and 24, another embodiment of a lighting device according to the present invention is provided with an optical member 71 divided into or otherwise including a plurality of shorter optical member portions 72. At ends of each of the optical member portions 72, walls 73 having a thickness less than a mounting interval between solid-state light emitting elements 12 are formed. A size of each of the optical member portions 72 is adapted such that the wall 73 is positioned at the midpoint between specific adjacent solid-state light emitting elements 12.

Next, an exemplary procedure for forming the optical member 71 in the lighting device 70 may be described. When the optical member 71 is formed, concave portions 74 of the optical member portions 72 are filled with a transparent silicone resin material and mounted from an end of the solid-state light emitting elements 12. Then, adjacent optical member portions 72 are joined to each other through the transparent silicone resin material. At this time, the transparent silicone resin material to be filled, the optical member portions 72, and transparent silicone resin material are made of the same material, and thereby after curing an integrated structure without any interface can be formed.

Figure 25:
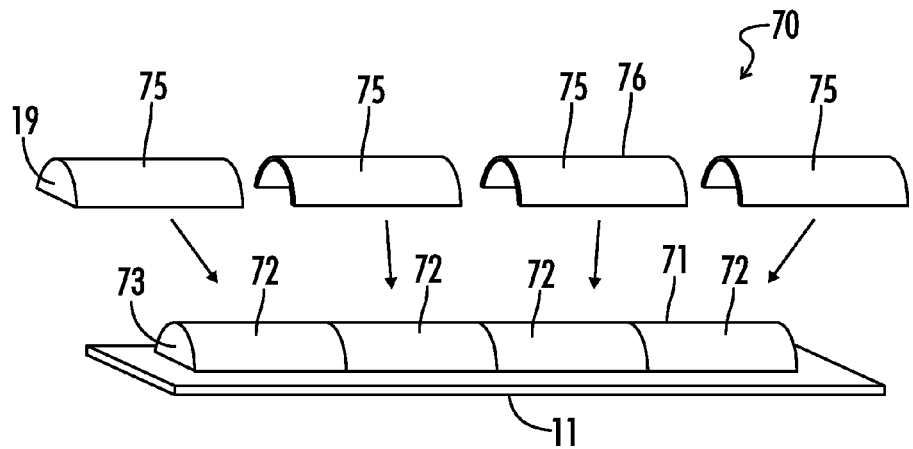
FIG. 25 is a perspective view of a variation of the lighting device of FIG. 23.

A variation of the lighting device 70 as represented in FIG. 25 is provided with a wavelength converting member 76 divided into or otherwise including a plurality of shorter wavelength converting member portions 75. In this case, the wavelength converting member portions 75 are preferably joined to each other through a silicone resin material containing the same phosphors as those of the wavelength converting member 76.

According to embodiments generally represented by FIGS. 23 to 25, by dividing the flexible optical member 71 or the wavelength converting member 76 molding is facilitated. Also, a void is unlikely to occur, so that yield is improved, and mounting is facilitated. This enables manufacturing costs to be reduced.

Figure 26:
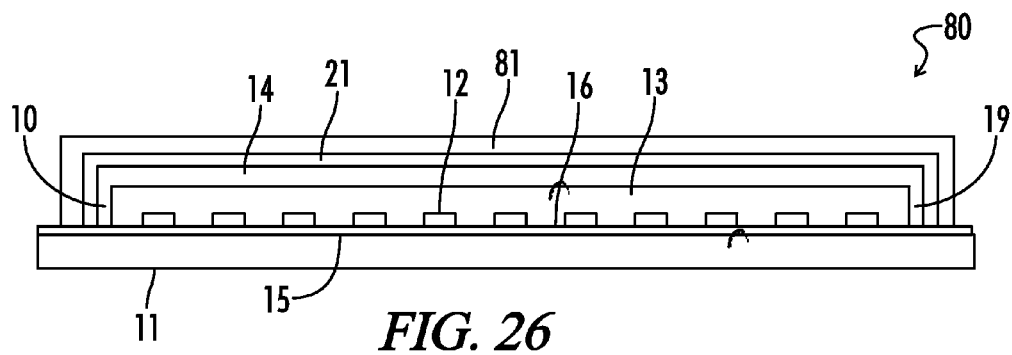
FIG. 26 is a cross-sectional front view of another embodiment of a lighting device according to the present invention.
Figure 27:
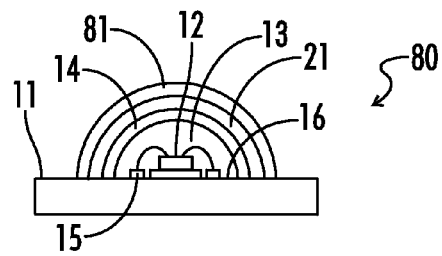
FIG. 27 is a cross-sectional side view of the lighting device of FIG. 26.

Referring now to FIGS. 26 and 27, another embodiment of a lighting device according to the present invention is provided with a translucent acrylic cover 81, which has a shape similar to that of a wavelength converting member 14, and which covers the wavelength converting member 14 with an intervening air layer 21. As an exemplary material for the cover 81, transparent resin such as polycarbonate or glass may be selected.

Note that, if the cover 81 is in close contact with the wavelength converting member 14, due to thermal expansion/shrinkage between the members, peeling at an interface occurs, or due to fixation, a static load is easily placed on the wavelength converting member 14 and the optical member 13 to reduce reliability. However, the cover 81 may be provided separately from the wavelength converting member 14, whereby neither the peeling at the interface nor the reduction in reliability occurs generally.

In accordance with a lighting device 80 so described, the cover 81 covers substantially the entire light emitting portion, and thereby any damage (e.g., wire disconnection, peeling, or scratch) due to an external load can be prevented. This substantially enables solid-state light emitting elements 12 to be protected from outside influence.

Note that a lighting device within the scope of the present invention is not explicitly limited to that in any of the above-described embodiments, but appropriate modification, improvement, or the like can be made in a manner as would be understood by one of ordinary skill in the art.

Figure 28:
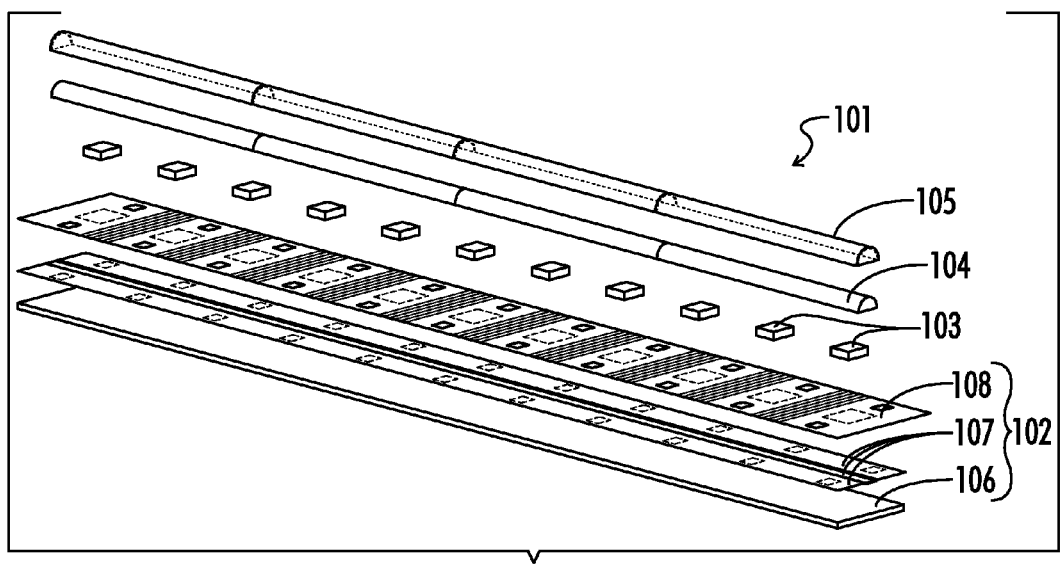
FIG. 28 is an exploded perspective view of a lighting device according to an embodiment of the present invention.
Figure 29A:
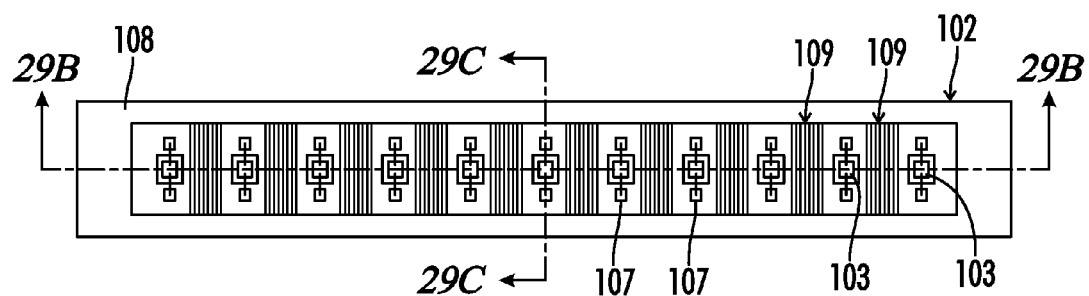
FIG. 29($a$) is a top view of the device of FIG. 28, FIG. 29($b$) is an A-A line cross-sectional view in (a), and FIG. 29($c$) is a B-B line cross-sectional view in (a).
Figure 29B:
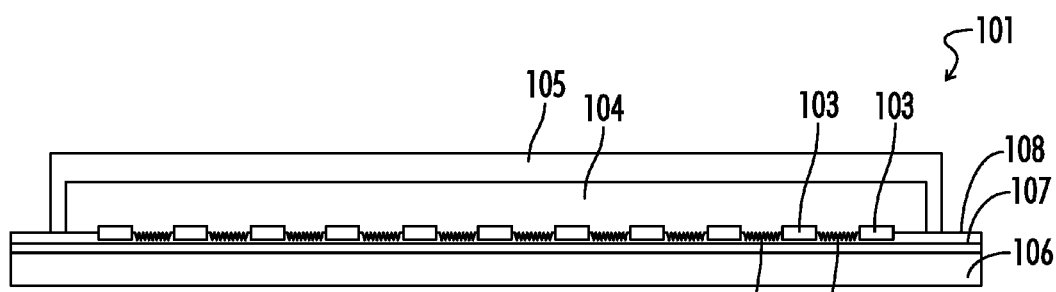
Figure 29C:
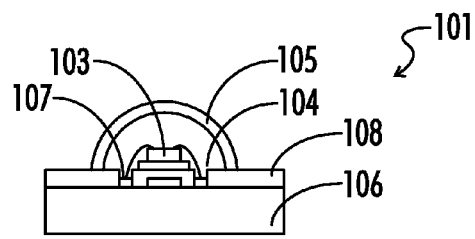

Referring now to FIGS. 28 and 29, another embodiment of a lighting device is provided with an oblong wiring board 102, a plurality of solid-state light emitting elements 103 (hereinafter referred to as light emitting elements) mounted on the wiring board 102, an optical member 104 (first translucent resin layer) that covers the plurality of light emitting elements 103, and a wavelength converting member 105 (light conversion portion) that covers the optical member 104. The wiring board 102 includes a wiring board base material 106, a wiring pattern 107 formed on the wiring board base material 106 and a white resist 106 formed on the wiring pattern 107.

The plurality of light emitting elements 103 are mounted on the wiring board 102 in line along a length direction (longitudinal) of the wiring board 102 at regular intervals. As such light emitting elements 103, for example, blue LEDs or the like made with use of nitride semiconductor or the like may be used.

The optical member 104 is made of a resin material having translucency, such as transparent silicone resin, is gutter-shaped in the length direction, and has a semicircular cross-sectional shape that is orthogonal to the length direction. Inside the optical member 104 including the center of a cross section of the optical member 104, a concave portion is formed so as to contain the plurality of light emitting elements 103 therein. At both ends of the optical member 104, lid portions not having a concave portion are formed. An outside diameter of the cross section of the optical member 104 is equal to or more than a number obtained by multiplying a diameter of a circumscribed circle of the plurality of solid-state light emitting elements 103 by a refractive index (in the case of the silicone resin, 1.41 times) of the optical member 104. In the concave portion formed in the optical member 104, resin having the same refractive index as that of the optical member 104 is filled, and thereby the optical member 104 seals the light emitting elements 103. After the filled resin has cured, it forms a structure integral with the optical member 104 to prevent an interface from being formed. An outer surface that is a circumferential curved surface of the optical member 104 serves as a light lead-out (emitting) surface that leads blue light emitted from the light emitting elements 103 outside the optical member 104.

The wavelength converting member 105 contains phosphors (yellow phosphors) that convert the blue light emitted from the plurality of light emitting elements 103 to yellow light. The wavelength converting member 105 is formed in a sheet-like shape so as to cover the light lead-out surface of the optical member 104. Also, between the light lead-out surface and the wavelength converting member 105, a layer made of a resin material (second translucent resin layer) or air layer may intervene.

A light diffusion member 109 is provided to diffuse the light emitted from the plurality of light emitting elements 103 and may generally be formed between adjacent light emitting elements 103. Note that a site between adjacent light emitting elements 103 includes, in a width direction orthogonal to an array direction of the light emitting elements, a region where the optical member 104 is arranged (optical member arrangement portion), and in a vertical direction, a region from a bottom surface of the wiring board 102 to an upper surface of the wavelength converting member 105. The light diffusion member 109 is configured to have, for example, a concave-convex shape formed in the white resist 108 between light emitting elements 103. The light diffused by the light diffusion member 109 is emitted above the light diffusion member 109. As the light diffusion member 109, in addition to forming the concave-convex shape, for example, diffusing particles may be arranged.

The wiring board base material 106 is formed with use of, for example, metal such as aluminum as a base material. The wiring pattern 107 has conductive property, and is formed in a predetermined pattern so as to be able to supply electricity to the plurality of light emitting elements 103. The white resist 108 may generally have a high reflectance.

An emission peak wavelength of the blue light emitted from the plurality of light emitting elements 103 is, for example, 460 nm, and a size of each of the light emitting elements 103 is, for example, 0.3 mm. A mounting method for the plurality of light emitting elements 103 employs a combination of die bonding and wire bonding. As the mounting method, in addition to the above, flip-chip bonding may be used, and the type and size of the light emitting element are not limited to those described above. The plurality of light emitting elements 103 may further alternatively be arranged in a plurality of lines.

Also, as a material for the optical member 104, in addition to the transparent silicone resin, epoxy resin or an inorganic material such as glass may be used. An outer shape of the optical member 104 may in various embodiments have a semielliptical shape.

Further, as a material for the wavelength converting member 105, transparent heat-resistant resin having a refractive index of 1.2 to 1.7 such as silicone resin may preferably be used. A thickness of the wavelength converting member 105 may preferably be set to 0.5 to 1.0 mm. As the phosphors contained in the wavelength converting member 105, for example, red phosphors and green phosphors may be mixed. This enables white light having high color rendering properties to be obtained. The wavelength converting member 105 may be formed by being coated on a surface of the optical member 104.

Still further, a size of the wiring board 102 may be provided with a length dimension of 200 mm×a width dimension of 20 mm. As a material for the wiring board base material 102, for example, glass epoxy or ceramic may be used. Note that in FIG. 29(a) the optical member 104 and the wavelength converting member 105 are not shown.

Figure 30:
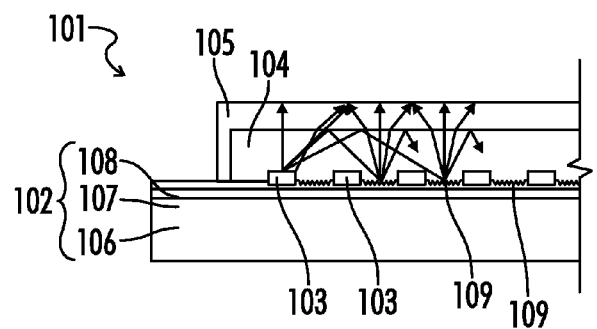
FIG. 30 is a cross-sectional view illustrating a light emitting method of the device of FIG. 28.
Figure 31:
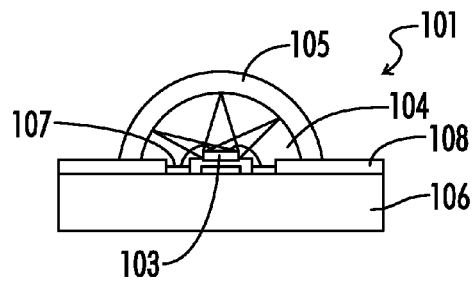
FIG. 31 is a cross-sectional view illustrating a light emitting method of the device of FIG. 28.

Next, a light emitting method for the above-described embodiment of a lighting device 101 may be described. As illustrated in FIGS. 30 and 31, part of the blue light emitted from the plurality of light emitting elements 103 passes through the optical member 104 and is irradiated on the wavelength converting member 105. Part of the blue light irradiated on the wavelength converting member 105 is irradiated on the phosphors contained in the wavelength converting member 105. The blue light irradiated on the phosphors is converted to the yellow light by the phosphors, and the yellow light is emitted from the phosphors. As a result, blue light not irradiated on the phosphors and the yellow light are combined and emitted as white light from the surface of the wavelength converting member 105.

The blue light emitted from the light emitting elements 103 includes blue light that is totally reflected by the light lead-out surface. Part of the totally reflected blue light is irradiated on the light diffusion members 109. The blue light irradiated on the light diffusion members 109 passes through the optical member 104, is irradiated on the wavelength converting member 105 positioned above the light diffusion members 109, and is emitted from the surface of the wavelength converting member 105. In this case, not only from the light emitting elements 103 but also from the sites between adjacent light emitting elements 103, the light is irradiated on the wavelength converting member 105, and therefore a ratio of light irradiated on the phosphors can be easily made substantially the same between the wavelength converting member 105 positioned above the light emitting elements 103 and the wavelength converting member 105 positioned above the light diffusion members 109. Note that, when the blue light is led to the wavelength converting member 105, in the same manner as above, the blue light and the yellow light are combined and emitted as white light from the surface of the wavelength converting member 105. Arrows illustrated in FIG. 30 indicate paths of light emitted from one of the light emitting elements 103.

The wavelength converting member 105 is formed in a semicircular cross-sectional shape around an array of the light emitting elements 103. Also, an outer surface that is a circumferential curved surface of the wavelength converting member 105 is sufficiently large in size with respect to an emission surface of each of the light emitting elements 103. Note that in FIG. 31 the light emitting element 103 is represented as being larger than the other members. For this reason, incident angle regions toward incident points A, B, and C where the blue light is incident on the wavelength converting member 105 are decreased and made substantially equal to one another. As a result, reflection on the surface of the wavelength converting member 105 is reduced, and therefore light can be efficiently extracted. Also, light path lengths in the wavelength converting member 105, and therefore a ratio of the blue light that is converted to the yellow light by the phosphors in the wavelength converting member 105, can easily be made substantially uniform and luminance unevenness and color unevenness on the surface of the wavelength converting member 105 can accordingly be reduced.

According to a lighting device 101 of an embodiment so described, the light emitted from the plurality of light emitting elements 103 is diffused by the light diffusion members 109 formed between adjacent light emitting elements 103, and irradiated on the wavelength converting member 105 containing the phosphors through the optical member 104. In this manner, not only from the light emitting elements 103, but also from the sites between adjacent light emitting elements 103, the light is irradiated on the wavelength converting member 105, and therefore a ratio in light irradiated on the phosphors can be made substantially the same between the wavelength converting member 105 positioned above the light emitting elements 103 and the wavelength converting member 105 positioned above the light diffusion members 109. As a result, the light can be easily made to substantially equally pass through a whole of the wavelength converting member 105, and therefore the luminance unevenness and the color unevenness on the surface of the wavelength converting member 105 can be reduced.

Figure 32:
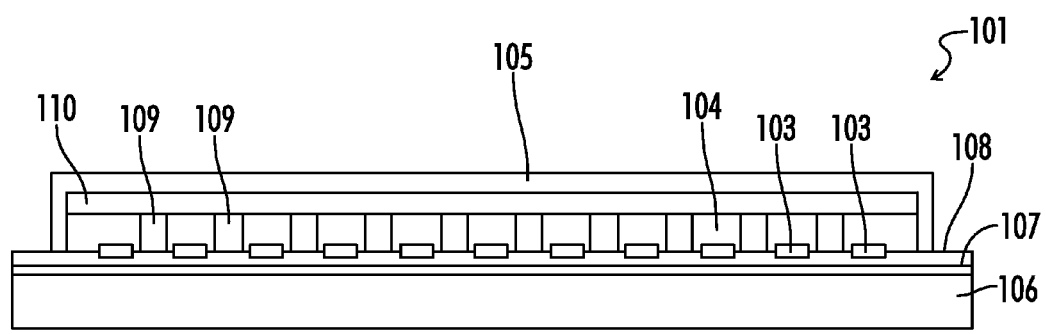
FIG. 32 is a cross-sectional view of a lighting device of another embodiment according to the present invention.

Referring next to FIG. 32, another embodiment of a lighting device 101 includes light diffusion members 109 configured such that, for example, a diffusing material is arranged in an optical member 104 between adjacent light emitting elements 103. Also, the optical member 104 is covered by a wavelength converting member 105 through an air layer 110. Even in this variation, the same effect as that in any of the above-described embodiments can be obtained, and total reflection of blue light on a light lead-out surface of the optical member 104 is increased to increase blue light led in a length (longitudinal) direction in the optical member 104, so that blue light diffused by each of the light diffusion members 109 is increased. Based on this, the blue light can be easily distributed equally to a whole of the wavelength converting member 105, and as a result luminance unevenness and color unevenness on a surface of the wavelength converting member 105 may be further reduced.

Figure 33:
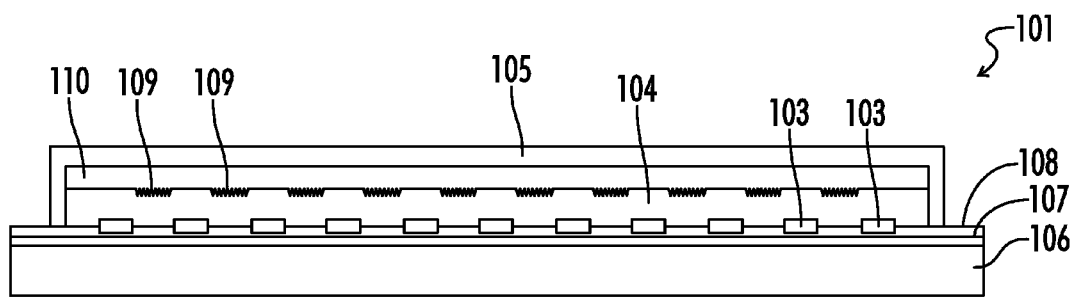
FIG. 33 is a cross-sectional view of a lighting device of another embodiment according to the present invention.

Referring now to FIG. 33, another embodiment of the lighting device 101 includes light diffusion members 109 configured such that a light lead-out surface of an optical member 104 positioned above sites between adjacent light emitting elements 103 is formed in a concave-convex shape, similar to a sawtooth-type arrangement. Also, the optical member 104 is covered by a wavelength converting member 105 through an air layer 110.

Figure 34:
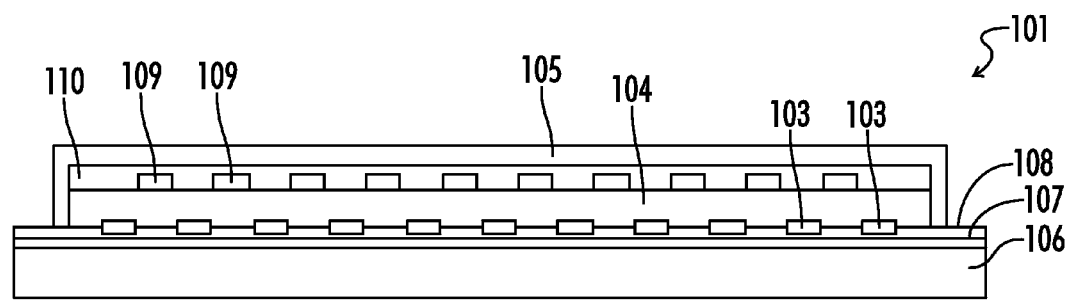
FIG. 34 is a cross-sectional view of a lighting device of another embodiment according to the present invention.

Referring to FIG. 34, another embodiment of a lighting device 101 includes light diffusion members 109 configured such that, for example, diffusing particles are arranged in an air layer 110 that is positioned on a light lead-out surface and above sites between adjacent light emitting elements 103. In this variation, an amount of light vertically led from the air layer 110 to a wavelength converting member 105 can be increased.

Figure 35:
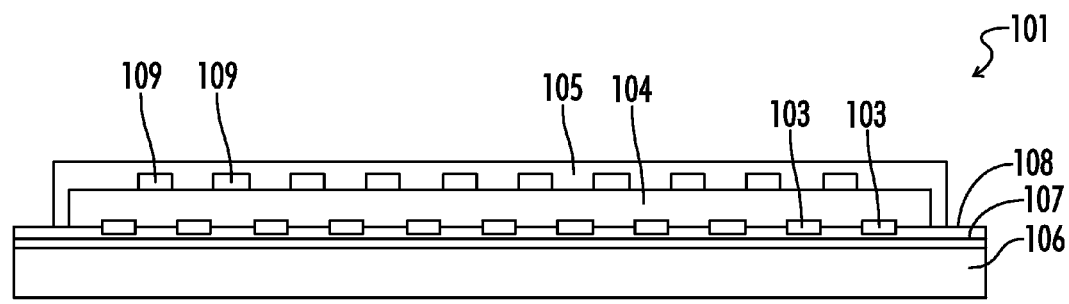
FIG. 35 is a cross-sectional view of a lighting device of another embodiment according to the present invention.

Referring now to FIG. 35, another embodiment of a lighting device 101 includes light diffusion members 109 configured such that, for example, diffusing particles are formed in a wavelength converting member 105 that is positioned above sites between adjacent light emitting elements 103. In this variation, a vertical component of light led to the wavelength converting member 105 can be increased.

Figure 36:
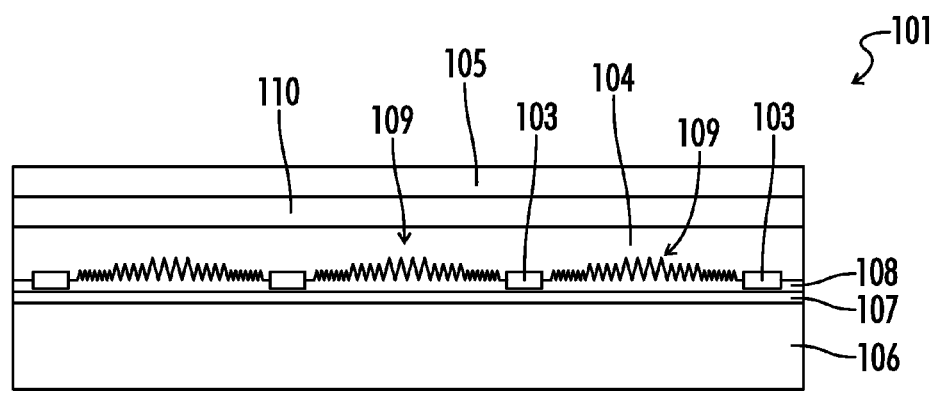
FIG. 36 is a cross-sectional view of a lighting device of another embodiment according to the present invention.

As represented in FIG. 36, another embodiment of a lighting device 101 includes light diffusion members 109 configured such that, for example, a white resist film 108 between adjacent light emitting elements 103 is formed in a concave-convex shape. A diffusion degree of each of the light diffusion members 109 is increased toward an intermediate position between adjacent light emitting elements 103, and decreased toward a light emitting element 103. In general, the weakest blue light of blue light passing through an optical member 104 is obliquely irradiated on the intermediate position between adjacent light emitting elements 103. In the variation represented in FIG. 36 and described herein, light irradiated on each of the light diffusion members 109 is diffused so as to be more intensely irradiated vertically on a wavelength converting member 105 as the light comes close to the intermediate position. Note that the light diffusion members 109 may be configured such that the optical member 104 between adjacent light emitting elements 103 is formed in a substantially concave-convex shape.

Figure 37:
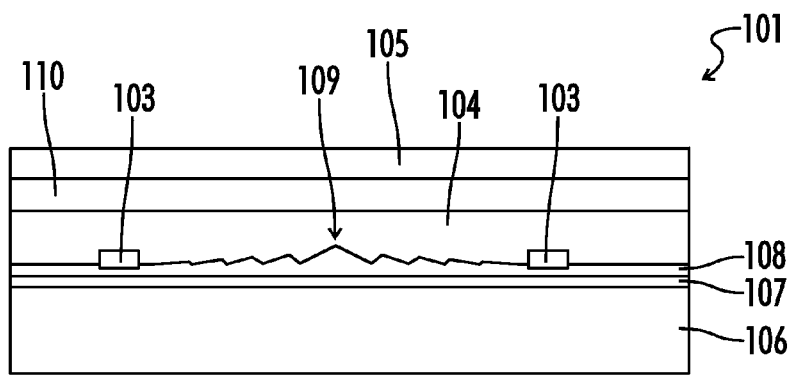
FIG. 37 is a cross-sectional view of a lighting device of another embodiment according to the present invention.
Figure 38A:
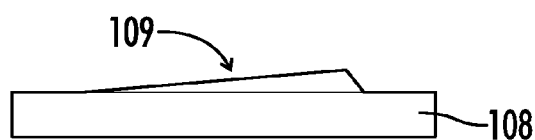
FIG. 38 is an enlarged cross-sectional view illustrating a configuration of a diffusion member in accordance with various embodiments of the present invention.
Figure 38B:
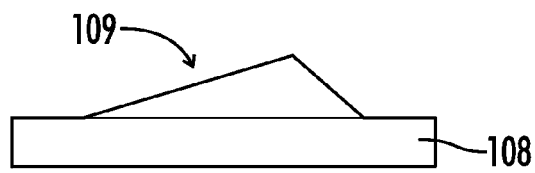
Figure 38C:
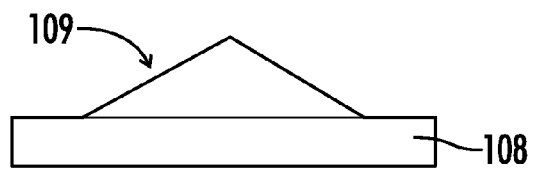

Referring next to FIG. 37, another embodiment of a lighting device 101 according to the present invention includes light diffusion members 109 configured such that, for example, a plurality of convex portions made of white resist 108 are continuously formed between adjacent light emitting elements 103 on a wiring board 102. An exemplary vertical cross-sectional shape of each of the plurality of convex portions is a triangle, and a shape of the triangle is different depending on a position where each of the concave portions is formed. An inclination angle of a triangle on a side close to a light emitting element 103 is relatively small, whereas on a side distant from the light emitting element 103 it is relatively large. FIGS. 38(a) to 38(c) represent a first convex portion formed adjacent to a light emitting element 103, a second convex portion formed in the center between adjacent light emitting elements 103, and a third convex portion formed between the first and second convex portions.

As illustrated in FIG. 38(a), it is assumed that an angle of one of inclined surfaces of the first convex portion is denoted by Ø1a, and an angle of the other inclined surface by Ø1b. As illustrated in FIG. 38(b), it is assumed that an angle of one of inclined surfaces of the second convex portion is denoted by Ø2a, and an angle of the other inclined surface by Ø2b. As illustrated in FIG. 38(c), it is assumed that an angle of one of inclined surfaces of the first convex portion is denoted by Ø3a, and an angle of the other inclined surface by Ø3b. The light diffusion member 109 is formed such that a relationship among the respective inclined surface angles meets $\varnothing1a<\varnothing3a<\varnothing2a=\varnothing2b<\varnothing3b<\varnothing1b$. In this variation, an amount of light irradiated on a light lead-out surface in substantially the center between adjacent light emitting elements 103 can be increased.

Figure 39A:
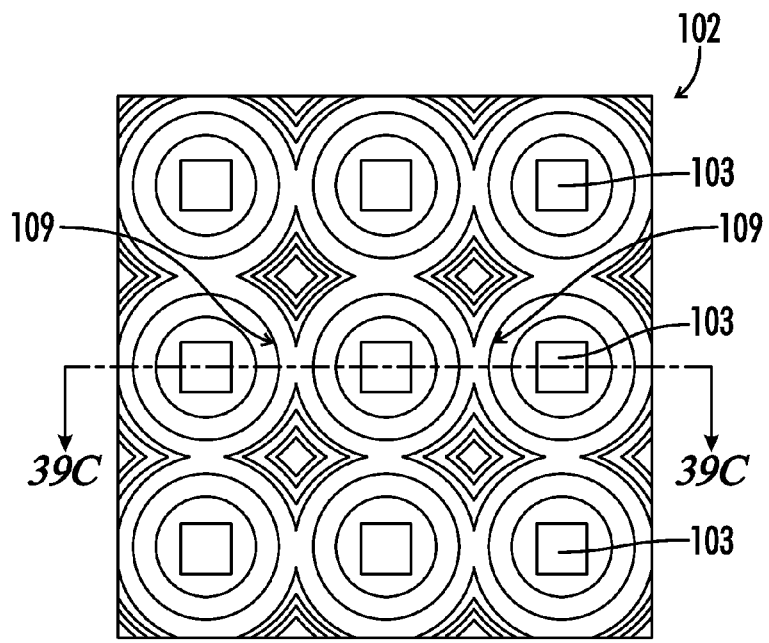
FIG. 39($a$) is a top view of a lighting device of another embodiment according to the present invention, (b) is a C-C line cross-sectional view in (a), and (c) is a cross-sectional view of an example of a different diffusion member shape in the same embodiment.
Figure 39B:
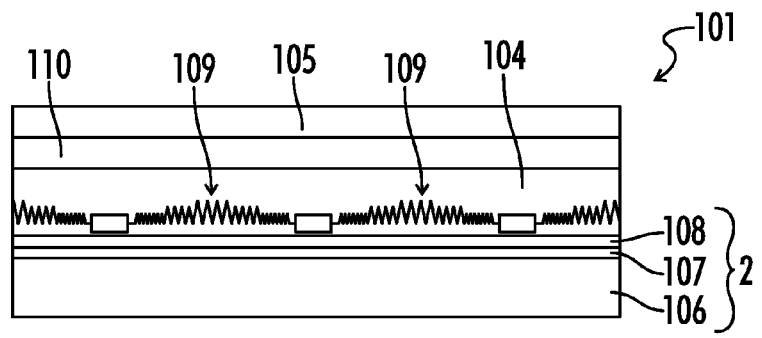
Figure 39C:
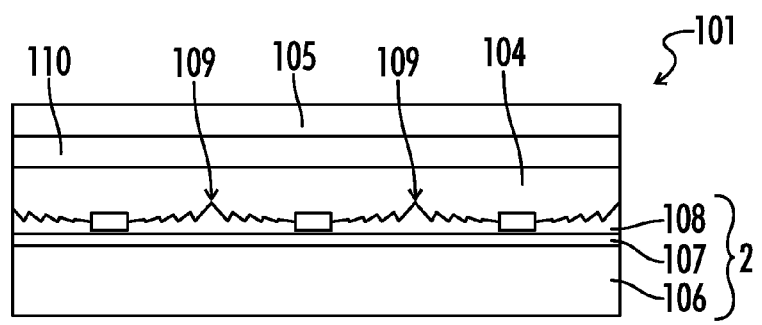

Referring now to FIGS. 39(a) to 39(c), another embodiment of a lighting device 101 includes a plurality of (nine in this variation) light emitting elements 103 arranged in a planar shape (3 rows×3 columns) on a rectangular wiring board 102. Light diffusion members 109 may be configured such that white resists 108 between adjacent light emitting elements 103 are formed in a substantially concave-convex shape and, as previously illustrated in FIG. 38(c), the light diffusion members 109 may be configured such that a plurality of convex portions made of white resist 108 are continuously formed between adjacent light emitting elements 103 on the wiring board 102. The plurality of light emitting elements 103 may be arranged in, in addition to the planar shape, a linear shape or a stereoscopic surface shape on a surface of a straight pipe, or the like. Note that, instead of forming the white resist 108 in the concave-convex shape, the optical member 104 or the wavelength converting member 105 may be formed in the concave-convex shape.

The present invention is not limited to the configuration of any of the above-described embodiments, but can be modified in various ways as may be appreciated by one having ordinary skill in the art without departing from the scope of the present invention. For example, while the light emitting element 103 as previously described is formed by a light emitting diode (LED), an organic electroluminescent element (organic EL element) or the like may be used alternatively and without limitation. Also, the light diffusion member 109 is not limited to forming a base material such as the white resist 108 in the concave-convex shape as described above if it can diffuse light, but may be configured by coating a light diffusing film on the wiring board 102. The white resist 108 formed on the wiring pattern 107 is further not limited to the above-described configurations, and various types of resist that can reflect light can be used.

The previous detailed description has been provided for the purposes of illustration and description. Thus, although there have been described particular embodiments of the present invention of a new and useful "Lighting Device Topology for Reducing Unevenness in LED Luminance and Color," it is not intended that such references be construed as limitations upon the scope of this invention except as set forth in the following claims.

What is claimed is:

1. A lighting device comprising:
a substrate;
a plurality of solid-state light emitting elements mounted on the substrate;
an optical member mounted on the substrate and arranged so as to cover light emitting surfaces of the plurality of solid-state light emitting elements, the optical member having a semicircular or semielliptical cross-sectional surface, and gutter-shaped in a longitudinal direction with respect to the substrate;
a wavelength converting member covering said semicircular or semielliptical cross-sectional surface of the optical member, the wavelength converting member excitable by light from the solid-state light emitting elements, and effective thereby to emit wavelength-converted light; and
a light diffusion member that is formed between adjacent ones of the plurality of solid-state light emitting elements and is configured to diffuse the light emitted from the plurality of light emitting elements,
the light diffusion member further comprising a diffusion degree that is increased toward an intermediate position between mutually adjacent solid-state light emitting elements, and is decreased toward each of the individual solid-state light emitting elements.

2. The lighting device of claim 1, a surface of the substrate comprising a region having a high reflectance, the region including at least a lower surface of the optical member.

3. The lighting device of claim 1, further comprising an air layer between the optical member and the wavelength converting member.

4. The lighting device of claim 3, further comprising a frame body between the optical member and the substrate, the frame body having a concave portion that contains the plurality of solid-state light emitting elements and in which is embedded at least a portion of the optical member.

5. The lighting device of claim 4, at least one end side of the substrate coinciding in position with a corresponding end side of the wavelength converting member.

6. The lighting device of claim 1, the optical member further comprising a plurality of optical portions coupled end-to-end to define an optical member length.

7. The lighting device of claim 1, the wavelength converting member further comprising a plurality of wavelength converting portions coupled end-to-end to define a wavelength converting member length.

8. The lighting device of claim 1, wherein:
a vertically cross-sectional shape of the light diffusion member along one side of the substrate forms a triangle; and
an inclination angle of the triangle on a side close to a solid-state light emitting element is small relative to an inclination angle of the triangle on a side distant from the solid-state light emitting element.

9. A lighting device comprising:
a plurality of solid-state light emitting elements;
a first translucent resin layer arranged to cover the plurality of solid-state light emitting elements;
a light converting member positioned to cover an outer surface of the first translucent resin layer, and contains a phosphor that converts a wavelength of emission light of the plurality of solid-state light emitting elements; and
a light diffusion member that is formed between the plurality of solid-state light emitting elements and is effective to diffuse the light emitted from the plurality of solid-state light emitting elements,
the light diffusion member further comprising a diffusion degree that is increased toward an intermediate position between mutually adjacent solid-state light emitting elements, and is decreased toward each of the individual solid-state light emitting elements.

10. The lighting device of claim 9, the light converting member positioned to cover the outer surface of the first translucent resin layer via an intermediate second translucent resin layer.

11. The lighting device of claim 9, the light converting member positioned to cover the outer surface of the first translucent resin layer via an intermediate air layer.

12. The lighting device of claim 9, the light diffusion member being formed in the first translucent resin layer.

13. The lighting device of claim 9, the light diffusion member being formed on the outer surface of the first translucent resin layer.

14. The lighting device of claim 9, the light diffusion member being formed between the first translucent resin layer and the light converting member.

15. The lighting device of claim 9, the light diffusion member being formed in the light converting member.

16. The lighting device of claim 9, wherein:
the light diffusion member is formed on a wiring board upon which are further mounted the plurality of solid-state light emitting elements;
a vertically cross-sectional shape of the light diffusion member along one side of the board forms a triangle; and
an inclination angle of the triangle on a side close to a solid-state light emitting element is small relative to an inclination angle of the triangle on a side distant from the solid-state light emitting element.

17. A lighting device comprising:
a plurality of solid-state light emitting elements;
a first translucent resin layer arranged to cover the plurality of solid-state light emitting elements;
a light converting member positioned to cover an outer surface of the first translucent resin layer, and containing a phosphor that converts a wavelength of emission light of the plurality of solid-state light emitting elements; and
a light diffusion member that is formed between the plurality of solid-state light emitting elements and is configured to diffuse the light emitted from the plurality of solid-state light emitting elements,
the light diffusion member formed on a wiring board upon which are further mounted the plurality of solid-state light emitting elements, wherein a vertically cross-sectional shape of the light diffusion member along one side of the board forms a triangle, further wherein an inclination angle of the triangle on a side close to a solid-state light emitting element is small relative to an inclination angle of the triangle on a side distant from the solid-state light emitting element.

* * * * *